(12) United States Patent
Zhang et al.

(10) Patent No.: US 11,959,973 B2
(45) Date of Patent: Apr. 16, 2024

(54) MULTI-FAULT DIAGNOSIS METHOD AND SYSTEM FOR BATTERY PACKS BASED ON CORRECTED SAMPLE ENTROPY

(71) Applicant: SHANDONG UNIVERSITY, Shandong (CN)

(72) Inventors: Chenghui Zhang, Jinan (CN); Yunlong Shang, Jinan (CN); Qi Zhang, Jinan (CN); Bin Duan, Jinan (CN)

(73) Assignee: SHANDONG UNIVERSITY, Jinan (CN)

( * ) Notice: Subject to any disclaimer, the term of this patent is extended or adjusted under 35 U.S.C. 154(b) by 160 days.

(21) Appl. No.: 17/765,204

(22) PCT Filed: Oct. 23, 2020

(86) PCT No.: PCT/CN2020/123303
§ 371 (c)(1),
(2) Date: Mar. 30, 2022

(87) PCT Pub. No.: WO2021/078257
PCT Pub. Date: Apr. 29, 2021

(65) Prior Publication Data
US 2022/0381849 A1 Dec. 1, 2022

(30) Foreign Application Priority Data
Oct. 25, 2019 (CN) .......................... 201911024438.2

(51) Int. Cl.
*G01R 31/396* (2019.01)
*G01R 31/3835* (2019.01)
(52) U.S. Cl.
CPC ....... *G01R 31/396* (2019.01); *G01R 31/3835* (2019.01)
(58) Field of Classification Search
None
See application file for complete search history.

(56) References Cited

U.S. PATENT DOCUMENTS

2015/0377977 A1* 12/2015 Yazami ................ G01R 31/392
  324/426
2017/0146608 A1    5/2017 Lee et al.

FOREIGN PATENT DOCUMENTS

| CN | 104614630 A | 5/2015 |
| CN | 107192954 A | 9/2017 |

(Continued)

OTHER PUBLICATIONS

Jan. 26, 2021 International Search Report issued in International Patent Application No. PCT/CN2020/123303.

(Continued)

*Primary Examiner* — Jas A Sanghera
(74) *Attorney, Agent, or Firm* — Oliff PLC

(57) ABSTRACT

A multi-fault diagnosis method has the following steps: measuring cell voltages of a battery pack to be diagnosed; constructing a cell voltage sequence according to measured cell voltages of the battery pack to be diagnosed, and calculating a sample entropy value of the cell voltage sequence; setting a correction coefficient for representing voltage fluctuation information, and correcting the sample entropy value through the correction coefficient to obtain a corrected sample entropy value; and judging and outputting a fault type of the battery pack to be diagnosed according to a numerical value change of the corrected sample entropy value. Faults of cells can be accurately diagnosed without a model, sample entropy values under different faults can be distinguished by setting the correction coefficient, the intuitiveness and efficiency of fault detection are improved, and the fault type and time of the lithium-ion cells can be quickly, accurately and stably diagnosed and predicted.

7 Claims, 7 Drawing Sheets

(56) References Cited

FOREIGN PATENT DOCUMENTS

| CN | 107255787 A | 10/2017 |
|----|-------------|---------|
| CN | 107422266 A | 12/2017 |
| CN | 107576915 A | 1/2018 |
| CN | 108226693 A | 6/2018 |
| CN | 108415880 A | 8/2018 |
| CN | 108562855 A | 9/2018 |
| CN | 110045298 A | 7/2019 |
| CN | 110703109 A | 1/2020 |
| WO | 2019/162749 A1 | 8/2019 |

OTHER PUBLICATIONS

Jan. 27, 2021 Written Opinion issued in International Patent Application No. PCT/CN2020/123303.

May 6, 2020 Office Action issued in Chinese Patent Applicaion No. 201911024438.2.

Wang, Zhenpo et al., "Voltage Fault Diagnosis and Prognosis of Battery Systems Based on Entropy and Z-Score for Electric Vehicles," Applied Energy, 2017.

Sun, Yu-Hua et al., "Diagnosis Method for the Degredation of Lead-Acid Battery," IEEE International Symposium on Industrial Electronics (ISIE 2009), Jul. 5-8, 2009.

Sun, Yu-Hua et al., "Auxiliary Diagnosis Method for Lead-Acid Battery Health Based on Sample Entropy," Energy Conservation and Management, 2009.

Lu, Mingzhe, "SOH Estimation and Failure Prediction Method Research for Power Batteries," Beijing University of Technology, Jun. 2015.

Tan, Fei, "Fault Diagnosis and Implementation of Electric Vehicle Lithium-Ion Battery System," Beijing Institute of Technology, Jan. 2015.

\* cited by examiner

MULTI-FAULT DIAGNOSIS METHOD AND SYSTEM FOR BATTERY PACKS BASED ON CORRECTED SAMPLE ENTROPY

BACKGROUND

Technical Field

The present disclosure relates to the technical field of battery fault diagnosis, in particular to a multi-fault diagnosis method and system for battery packs based on corrected sample entropy.

RELATED ART

The description in this section merely provides background technology information related to the present disclosure and does not necessarily constitute the prior art.

Electric vehicles (such as Tesla) are becoming increasingly popular due to energy crisis, environmental pollution and temperature change. As power sources of electric vehicles, lithium-ion batteries have extremely important influence on the power performance, economical efficiency and safety of electric vehicles. According to statistics, 52% of the faults in 1.95 million electric vehicles are caused by lithium-ion batteries. Battery faults are mainly caused by two reasons. On one hand, electrochemical reactions in the lithium-ion cells are extremely complex, and are very sensitive to environmental temperature and battery aging. On the other hand, a lithium-ion battery pack usually consists of thousands of completely inconsistent battery cells. Therefore, in order to prevent high-risk faults of the batteries, it is necessary and valuable to develop an efficient diagnosis method for early faults of lithium-ion battery packs.

At present, the provided battery fault diagnosis methods can be divided into three categories: ① the fault diagnosis methods based on threshold values; ② the fault diagnosis methods based on equivalent circuit models, mainly including adaptive extended Kalman filter (AEKF) methods; and ③ the data-driven-based fault diagnosis methods, mainly including a correlation coefficient method, a neural network method, a fuzzy logic method, a support vector machine method and an entropy method. In recent years, an emerging fault diagnosis method based on data drive has become the focus of battery research because it does not need an accurate battery model, has a low computational cost, and is easy to implement on-line. The method based on entropy has attracted much attention, and is suitable for battery fault diagnosis under severe voltage fluctuation, and is very suitable for being applied to electric vehicles. However, the current entropy-based method cannot accurately and quickly detect the early battery fault type and time, and is poor in robustness and high in computational cost.

SUMMARY

In order to solve the above problems, the present disclosure provides a multi-fault diagnosis method and system for lithium-ion battery packs based on corrected sample entropy, which can accurately diagnose battery faults without a model and can quickly, accurately and stably diagnose and predict the fault type and time of lithium-ion battery packs.

To achieve the foregoing objective, the present disclosure uses the following technical solutions:

One or more embodiments provide a multi-fault diagnosis method for battery packs based on corrected sample entropy, comprising the following steps:

measuring cell voltages of a battery pack to be diagnosed;

constructing a cell voltage sequence according to the measured cell voltages of the battery pack to be diagnosed, and calculating a sample entropy value of the cell voltage sequence;

setting a correction coefficient for representing voltage fluctuation information, and correcting the sample entropy value through the correction coefficient to obtain a corrected sample entropy value; and judging and outputting a fault type of the battery pack to be diagnosed according to a numerical value change of the corrected sample entropy value.

The correction coefficient for representing a voltage fluctuation direction is as follows:

When the real-time cell voltage at the time t is smaller than the average cell voltage in a sliding window N, the correction coefficient is a negative number, when the real-time cell voltage at the time t is larger than the average cell voltage in a sliding window N, the correction coefficient is a positive number, and when the real-time cell voltage at the time t is equal to the average cell voltage in a sliding window N, the correction coefficient is zero.

In the judging and outputting the fault type of the battery pack to be diagnosed, the judging method specifically comprises:

If the corrected sample entropy value suddenly rises, judging that an over-voltage or open-circuit fault occurs; and if the corrected sample entropy value suddenly drops, judging that an under-voltage or short-circuit fault occurs.

One or more embodiments provide a battery pack multi-fault diagnosis system based on corrected sample entropy, comprising:

a module, configured to measure cell voltages of a battery pack to be diagnosed;

a module, configured to construct a cell voltage sequence according to the measured cell voltages of the battery pack to be diagnosed and calculate a sample entropy value of the cell voltage sequence;

a module, configured to set a correction coefficient for representing voltage fluctuation information, and correct the sample entropy value through the correction coefficient to obtain a corrected sample entropy value; and a module, configured to judge and output a fault type of the battery pack to be diagnosed according to a numerical value change of the corrected sample entropy value.

The correction coefficient for representing a voltage fluctuation direction is as follows:

when the real-time cell voltage at the time t is smaller than the average cell voltage in a sliding window N, the correction coefficient is a negative number;

when the real-time cell voltage at the time t is larger than the average cell voltage in a sliding window N, the correction coefficient is a positive number; and when the real-time cell voltage at the time t is equal to the average cell voltage in a sliding window N, the correction coefficient is zero.

A judging method of the module configured to judge and output the fault type of the battery pack to be diagnosed specifically comprises:

if the corrected sample entropy value suddenly rises, judging that an over-voltage or open-circuit fault occurs; and if the corrected sample entropy value suddenly drops, judging that an under-voltage or short-circuit fault occurs.

Further provided is an electronic device, comprising a memory, a processor and computer instructions stored on the memory and executed on the processor, wherein the steps of the above method are completed when the computer instructions are executed by the processor.

Further provided is a computer readable storage medium, configured to store the computer instructions, wherein the steps of the above method are completed when the computer instructions are executed by the processor.

Compared with the prior art, the present disclosure has the following beneficial effects:

(1) The present disclosure provides a fault detection method based on the sample entropy of a cell voltage sequence, which can accurately diagnose the faults of battery packs without a model, can quickly, accurately and stably diagnose and predict the fault type and time of lithium-ion battery packs, and can predict the battery fault in advance when the batteries have no obvious abnormal phenomenon.

(2) The fault type and time can be detected by introducing a correction coefficient α representing the voltage fluctuation information. The sample entropy values under different faults can be distinguished by setting the correction coefficient. The intuitiveness and efficiency of the fault detection are markedly improved.

(3) The sliding window N is adopted to update cell voltage data. The diagnosis sensitivity to faults is maintained by setting the length of the collected data. The computational cost is low, and real-time implementation is facilitated.

(4) By adopting the sample entropy value to optimize a tolerance, the method can prevent false detection, has particularly strong robustness to the measurement noise and cell inconsistency, and is easy to implement on-line in real time.

BRIEF DESCRIPTION OF THE DRAWINGS

The accompanying drawings constituting a part of the present disclosure are used to provide further understanding of the present disclosure. Schematic embodiments of the present disclosure and descriptions thereof are used to explain the present disclosure, and do not constitute a limitation to the present disclosure.

FIG. 5 (b) is a multi-fault diagnosis diagram of a lithium-ion battery pack with a sliding window of 30 based on the corrected sample entropy algorithm for the voltage sequence of FIG. 2 of an example of Embodiment 1 of the present disclosure.

FIG. 5 (c) is a multi-fault diagnosis diagram of a lithium-ion battery pack with a sliding window of 5 based on the corrected sample entropy algorithm for the voltage sequence of FIG. 2 of an example of Embodiment 1 of the present disclosure.

FIG. 5 (d) is a multi-fault diagnosis diagram of a lithium-ion battery pack with a sliding window of 4 based on the corrected sample entropy algorithm for the voltage sequence of FIG. 2 of an example of Embodiment 1 of the present disclosure.

FIG. 6 (b) is a multi-fault diagnosis diagram of a lithium-ion battery pack at a tolerance of 0.5 based on the corrected sample entropy algorithm for the voltage sequence of FIG. 2 of an example of Embodiment 1 of the present disclosure.

FIG. 7 (b) is a multi-fault diagnosis diagram of a lithium-ion battery pack with a sliding window of 60 based on the corrected sample entropy algorithm for the voltage sequence of FIG. 7 (a) of an example of Embodiment 1 of the present disclosure.

FIG. 7 (c) is a multi-fault diagnosis diagram of a lithium-ion battery pack with a sliding window of 5 based on the corrected sample entropy algorithm for the voltage sequence of FIG. 7 (a) of an example of Embodiment 1 of the present disclosure.

DETAILED DESCRIPTION

The present disclosure is further described below with reference to the accompanying drawings and embodiments.

It should be noted that, the following detailed descriptions are all exemplary, and are intended to provide further descriptions of the present disclosure. Unless otherwise specified, all technical and scientific terms used herein have the same meaning as commonly understood by a person of ordinary skill in the technical field to which the present disclosure belongs.

It should be noted that terms used herein are only for describing specific implementations and are not intended to limit exemplary implementations according to the present disclosure. As used herein, the singular form is intended to include the plural form, unless the context clearly indicates otherwise. In addition, it should further be understood that terms "include" and/or "comprise" used in this specification indicate that there are features, steps, operations, devices, components, and/or combinations thereof. It should be noted that embodiments of the present disclosure and features in the embodiments can be combined with each other in the case of no conflict. The following describes the embodiments in detail with reference to the accompanying drawings.

Figure 1:
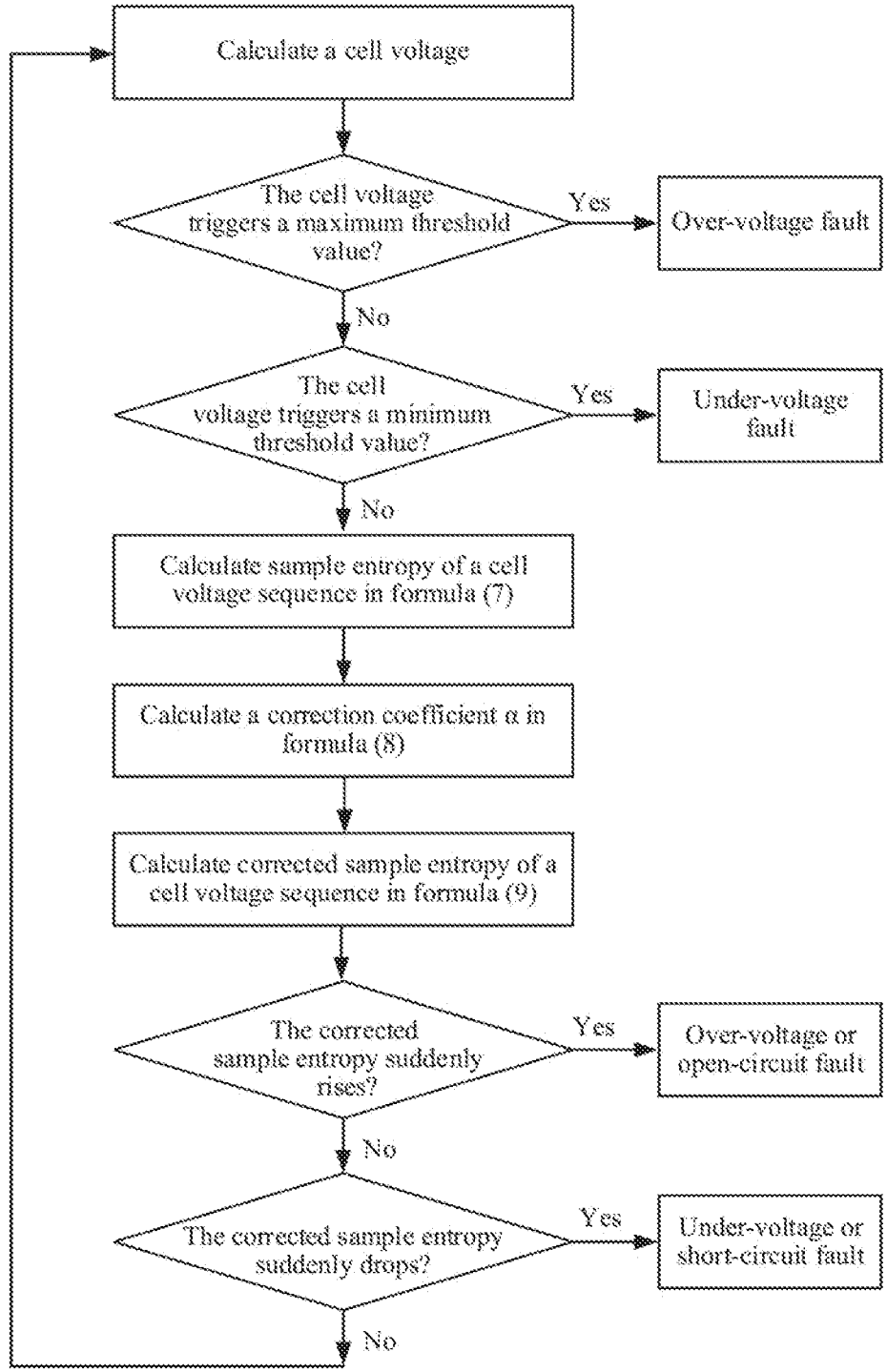
FIG. 1 is a flowchart of a method of Embodiment 1 of the present disclosure.

In the technical solutions disclosed in one or more embodiments, as shown in FIG. 1, a multi-fault diagnosis method for battery packs based on corrected sample entropy comprises the following steps:

1. measuring cell voltages of a battery pack to be diagnosed;

2. constructing a cell voltage sequence according to the measured cell voltages of the battery pack to be diagnosed, and calculating a sample entropy value of the cell voltage sequence;

3. setting a correction coefficient for representing voltage fluctuation information, and correcting the sample entropy value through the correction coefficient to obtain a corrected sample entropy value; and 4. judging and outputting the fault type of the battery pack to be diagnosed according to a change of the corrected sample entropy value, triggering a corresponding battery fault alarm apparatus for giving an alarm when a fault is diagnosed, and meanwhile transmitting data of the corrected sample entropy value to facilitate relevant personnel to quickly search for a fault cause.

A pre-judgment step is further comprised before the step 2 after the step 1, and may comprise the following steps:

setting a threshold range of cell voltages;

judging whether a cell voltage is larger than a maximum threshold value of the threshold range or not, if yes, judging that an over-voltage fault occurs, and if not, executing the next step; and judging whether a cell voltage is smaller than a minimum threshold value of the threshold value range or not, if yes, judging that an under-voltage fault occurs, and if not, executing the next step.

In the step 2, constructing the cell voltage sequence according to the measured cell voltages of the battery pack to be diagnosed, and calculating the sample entropy value of the cell voltage sequence, specific steps may be as follows:

21. according to the collected measured cell voltages of the battery pack to be diagnosed, constructing a time series by adopting N cell voltage data, and constructing a cell voltage vector V(i) as follows:

$$V(i)=[V(i),V(i+1),\ldots,V(i+m-1)], i=1,2,\ldots,N-m+1 \quad (1)$$

where m is a length of the window, and is usually set to 2 to accurately measure a change of the cell voltages;

22. calculating a first probability of matching of two time series of the m window length and a second probability of matching of two time series of an m+1 window length, wherein a distance $d[V_m(i),V_m(j)]$ between the two time series $V_m(i)$ and $V_m(j)$ of the m window length is a maximum absolute difference which may be shown as:

$$d[V_m(i),V_m(j)]=\max[|V_m(i+k)-V_m(j+k)|], 0 \leq k \leq m-1 \quad (2)$$

where, for each i, a distance between $V_m(i)$ and other voltage points $V_m(j)$ (j=1, 2, ... n−m; j≠i) is calculated, the number of $d[V_m(i),V_m(j)]$ smaller than a tolerance r is counted, and a proportion of this number to a total distance N−m+1 is calculated, specifically as follows:

$$B_i^m(r) = \frac{1}{N-m+1} W^m(i), i = 1, 2, \ldots, N-m+1 \quad (3)$$

where $W^m(i)$ is the number of $d[V_m(i),V_m(j)] \leq r$, i≠j, and the probability of matching of the two time series of the in window length may be shown as:

$$B^m(r) = \frac{1}{N-m} \sum_{i=1}^{N-m} B_i^m(r) \quad (4)$$

where a calculating method of the probability of matching of the two time series $V_{m+1}(i)$ and $V_{m+1}(j)$ of the m+1 window length is the same as the calculating method of the probability of matching of the two time series of the m window length:

for each i, a distance $d[V_{m+1}(i), V_{m+1}(j)]$ between $V_{m+1}(i)$ and other voltage points $V_{m+1}(j)$ (j=1, 2, ... n−m; j≠i) is calculated, the number of $d[V_{m+1}(i), V_{m+1}(j)]$ smaller than the tolerance r is counted, and a proportion of this number to a total distance N−m+1 is calculated, specifically as follows:

$$A_i^m(r) = \frac{1}{N-m+1} W^{m+1}(i), i = 1, 2, \ldots, N-m+1 \quad (5)$$

where $W^{m+1}(i)$ is the number of $d[V_{m+1}(i), V_{m+1}(j)] \leq r$, i≠j, and the probability of matching of the two time series of the m+1 window length may be shown as:

$$A^m(r) = \frac{1}{N-m} \sum_{i=1}^{N-m} A_i^m(r) \quad (6)$$

23. calculating a sample entropy value according to the first probability and the second probability, wherein the sample entropy value is a conditional probability of matching of the series of the m+1 window length when the series of the m window length are matched within the tolerance r, and may be shown as:

$$\text{SampEn}(m,r,N)=-\ln[A^m(r)/B^m(r)] \quad (7).$$

It can be obtained from the formula (3) and formula (5) that a too small tolerance leads to false detection and a too large tolerance leads to failure of fault detection. Theoretically, for an infinite number of data, the tolerance will approach 0. However, for a limited number of data, the tolerance should generally be within 10-20% of a standard deviation of the data. By adopting the sample entropy value method to optimize the tolerance, the method can prevent false detection, has particularly strong robustness on measurement noise and cell inconsistency, and is easy to implement on-line in real time.

For on-line implementation, the sample entropy value of the cell voltage sequence should be calculated in real time. Thus, a sliding window is configured to update cell data in real time and maintain sensitivity of sample entropy to faults. Particularly, a sample entropy value at each time is calculated from a cell voltage in the previous historical sliding window. It is worth noting that N in the formula (1) represents the size of the sliding window. The size of the sliding window essentially determines the sample entropy value and the sensitivity of the sample entropy to faults. According to the formulas (5)-(7), for the same cell voltage sequence, the smaller the sliding window is, the larger the sample entropy value is, indicating a higher sensitivity to faults, and therefore a smaller sliding window can provide better accuracy in battery fault diagnosis. However, according to the formulas (5)-(7), when the size of the sliding window is less than 5, the sample entropy value is constant to 0 regardless of any abnormal change in cell voltages, which means that the provided method cannot detect any faults when the sliding window is too small.

Theoretically, the optimal sliding window size is 5, and the sample entropy can achieve strong robustness and efficient calculation for measurement noise and interference. The embodiment sets the value of the sliding window N not less than 5.

The step 3 is a correction step. No matter whether the cell voltage suddenly rises or drops, the sample entropy value of the cell voltage sequence is always non-negative and cannot directly represent and predict various types of battery faults. According to the embodiment, the correction coefficient for representing the voltage fluctuation information is set, and the sample entropy value is corrected through the correction coefficient to obtain the corrected sample entropy value.

Optionally, the correction coefficient for representing the voltage fluctuation direction is as follows:

when the real-time cell voltage at the time r is smaller than the average cell voltage in a sliding window N, the correction coefficient is a negative number;

when the real-time cell voltage at the time t is larger than the average cell voltage in a sliding window N, the correction coefficient is a positive number; and when the real-time cell voltage at the time t is equal to the average cell voltage in a sliding window N, the correction coefficient is zero.

Details may be as follows:

$$\alpha = \begin{cases} -1, & \text{When } V(t) < V_{avg} \\ 1, & \text{When } V(t) > V_{avg} \\ 0, & \text{Otherwise} \end{cases} \qquad (8)$$

where, V(t) is the real-time cell voltage at the time t, and $V_{avg}$ is the average cell voltage in a sliding window N.

Sample entropy values under different faults can be distinguished by setting the correction coefficient, and the intuitiveness and efficiency of fault detection are improved.

The sample entropy value of the cell voltage sequence can be improved as:

$$S = \alpha \times \text{SampEn}(m, r, N) \qquad (9).$$

In the step 4 of judging and outputting the fault type of the battery pack to be diagnosed according to the change of the corrected sample entropy value, the judging method specifically comprises:

if the sample entropy value suddenly rises, judging that an over-voltage or open-circuit fault occurs; and if the sample entropy value suddenly drops, judging that an under-voltage or short-circuit fault occurs.

Figure 2:
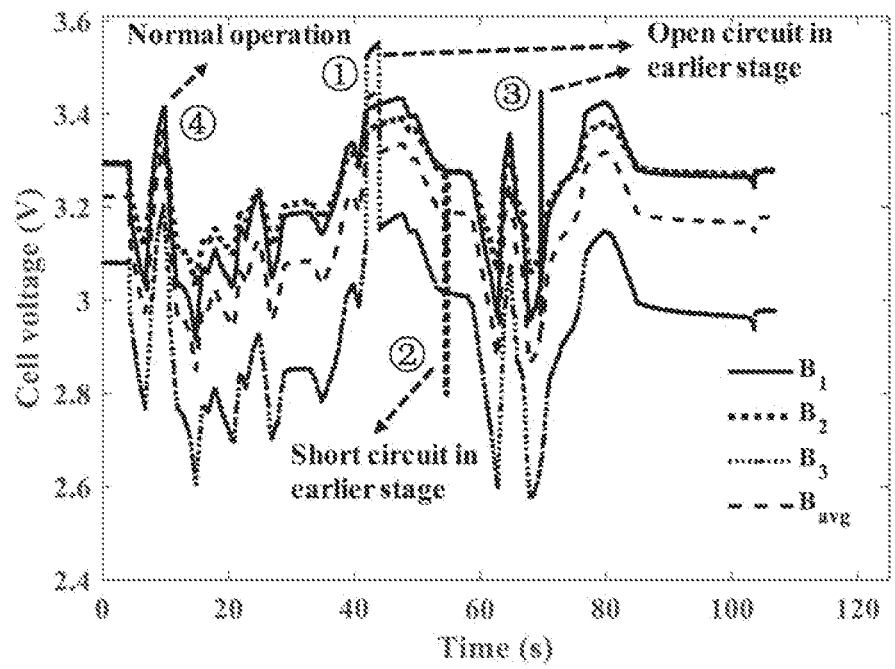
FIG. 2 is a diagram of a cell voltage sequence measured under UDDS conditions of an example of Embodiment 1 of the present disclosure.

The following illustrates methods and effects of the embodiments through specific examples:

1. Measurement of a battery-pack voltage. FIG. 2 is a voltage sequence of three series-connected lithium-ion cells (numbered B1, B2 and B3), formed when a short-circuit fault and an open-circuit fault exist under an urban road circulation (UDDS) condition. Inconsistency of the cell voltages can be noticed, and the voltage of B3 is lower than that of B1 and B2. Because the same charge-discharge current is used, the voltage fluctuation trends of the three series-connected lithium-ion cells are consistent. At 41.92 seconds of the UDDS circulation condition, an open-circuit fault occurs in B3, resulting in a sudden increase in the cell voltage to 3.512 V. At 54.54 seconds, one wire is used to produce a short-circuit in B2 for approximately 0.13 second, which results in a sudden drop in cell voltage of 0.487 V in this period. When the short-circuit fault disappears, the cell voltage returns to normal. At 69.53 seconds, an open-circuit fault occurs in B1, resulting in a sudden increase in cell voltage of 0.414 V. All cell voltages of the embodiment do not trigger a cutoff voltage at the time of cell charge and discharge in the event of a fault.

2. Judgment of whether a cell voltage triggers a maximum threshold value or not. If yes, it indicates that an over-voltage fault occurs, and if not, the next step is executed.

3. Judgment of whether a cell voltage triggers a minimum threshold value or not. If yes, it indicates that an under-voltage fault occurs, and if not, the next step is executed.

Figure 3:
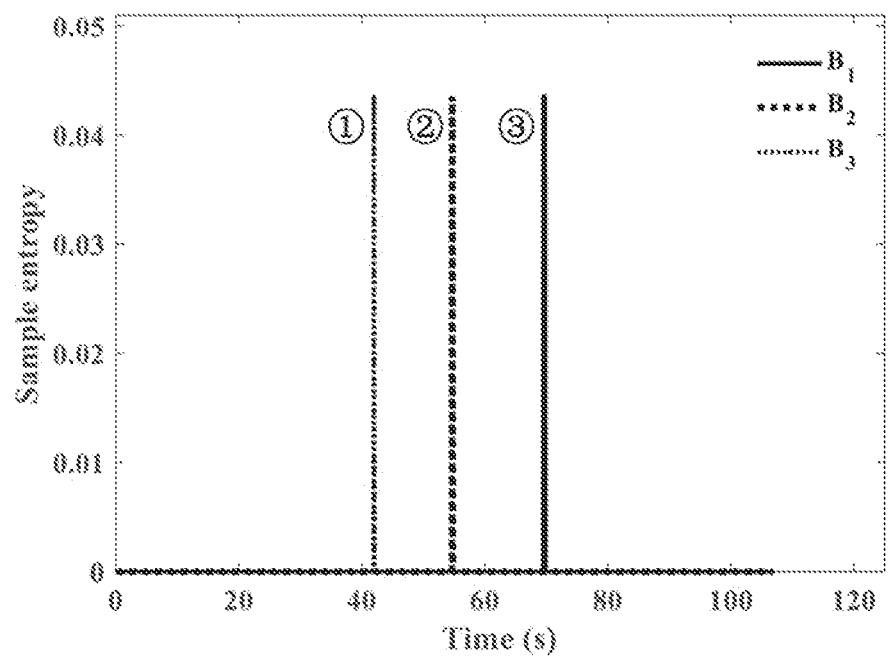
FIG. 3 is a multi-fault diagnosis diagram of a lithium-ion battery pack based on a sample entropy algorithm of an example of Embodiment 1 of the present disclosure.

4. Calculation of a sample entropy value of the cell voltage sequence according to the formula (7). According to a fault diagnosis result of the cell voltage sequence of sample entropy without a correction coefficient shown in FIG. 3, the size N of the sliding window is set to 60, and the tolerance r is set to 0.15, it can be clearly observed that the sample entropy value of the cell voltage suddenly increases (exceeds 0.04) when the fault occurs due to a voltage abrupt change. However, when the cell voltage is normal, the sample entropy value is 0, so the provided fault diagnosis method based on sample entropy cannot trigger alarm mistakenly under the normal voltage condition. Compared with the diagram of the cell voltage sequence shown in FIG. 2, the sample entropy is very sensitive to abnormal voltage, which indicates that the sample entropy can detect battery faults even if the cell voltage is in the safe range, and can realize warning in advance. However, the multi-fault diagnosis result of a lithium-ion cell based on conventional sample entropy shown in FIG. 3 shows that the sample entropy value of the cell voltage sequence is always non-negative regardless of any fault type of the cell, and therefore, the multi-fault diagnosis method of the lithium-ion cell based on the sample entropy cannot distinguish the fault type of the cell, and the sample entropy is corrected in the embodiment.

Figure 4:
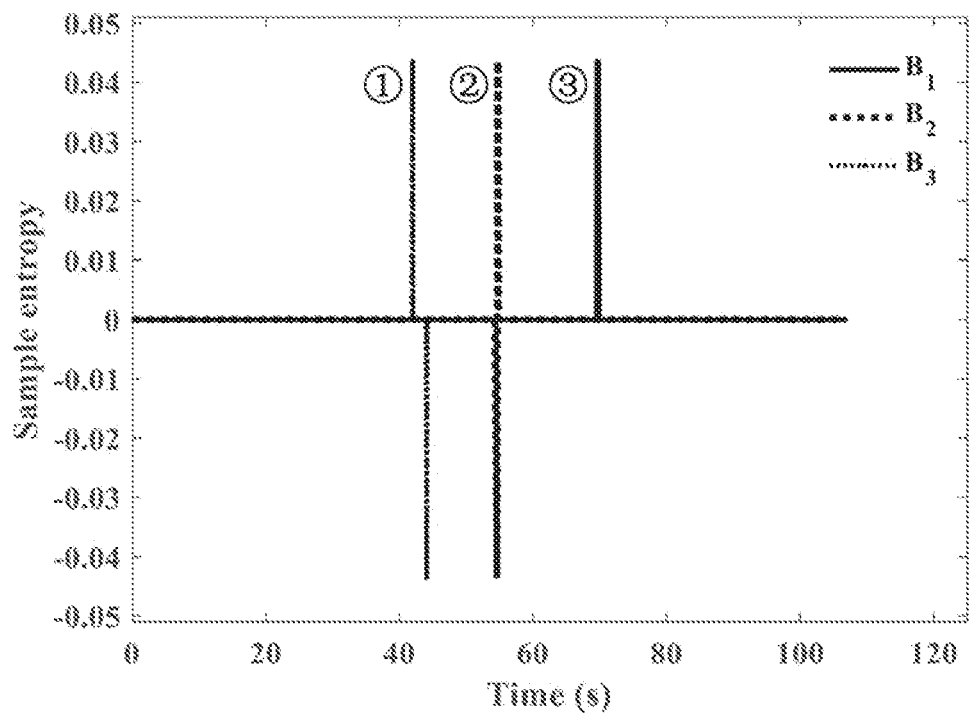
FIG. 4 is a multi-fault diagnosis diagram of a lithium-ion battery pack based on a corrected sample entropy algorithm for the voltage sequence of FIG. 2 of an example of Embodiment 1 of the present disclosure.
Figure 5A:
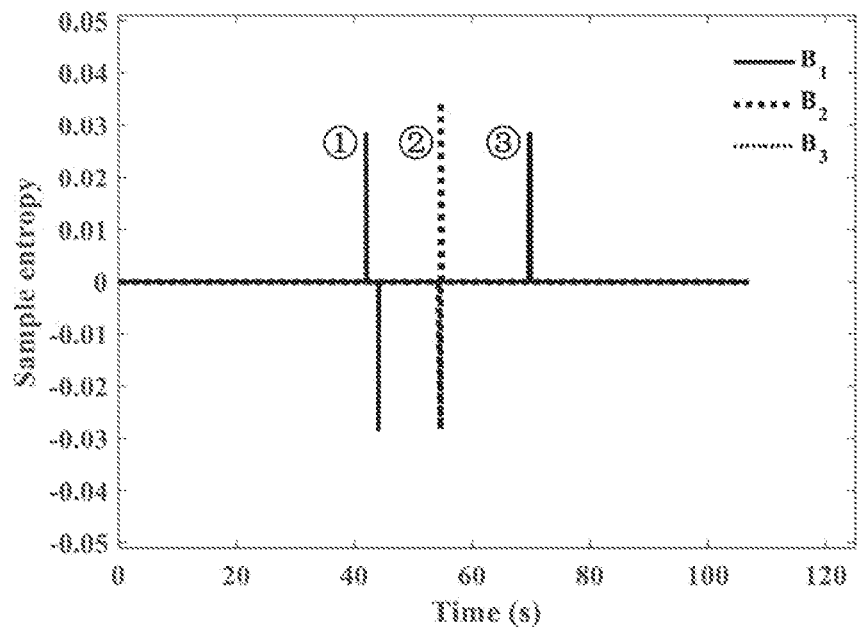
FIG. 5 (a) is a multi-fault diagnosis diagram of a lithium-ion battery pack with a sliding window of 90 based on the corrected sample entropy algorithm for the voltage sequence of FIG. 2 of an example of Embodiment 1 of the present disclosure.
Figure 5B:
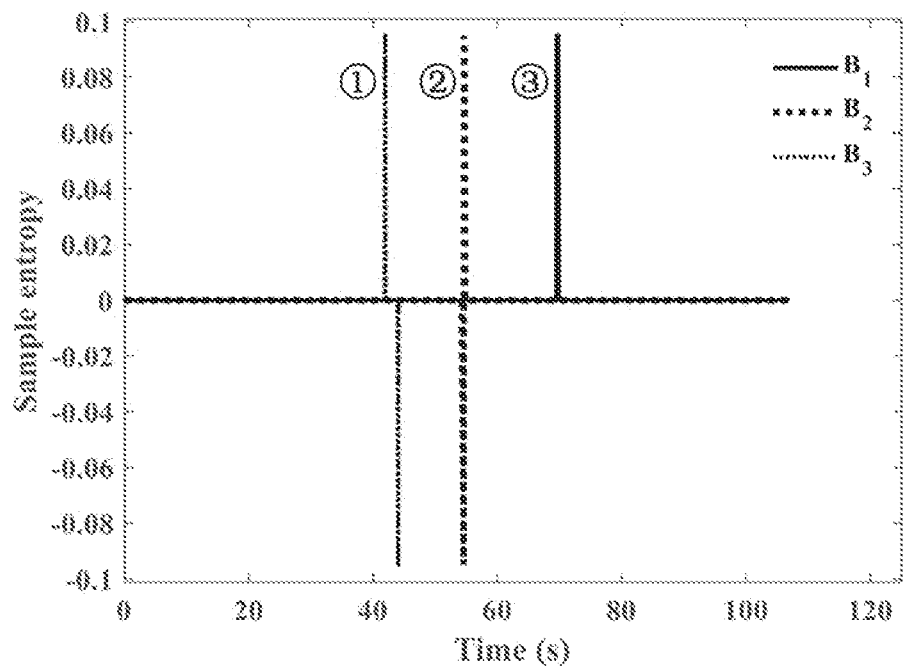
Figure 5C:
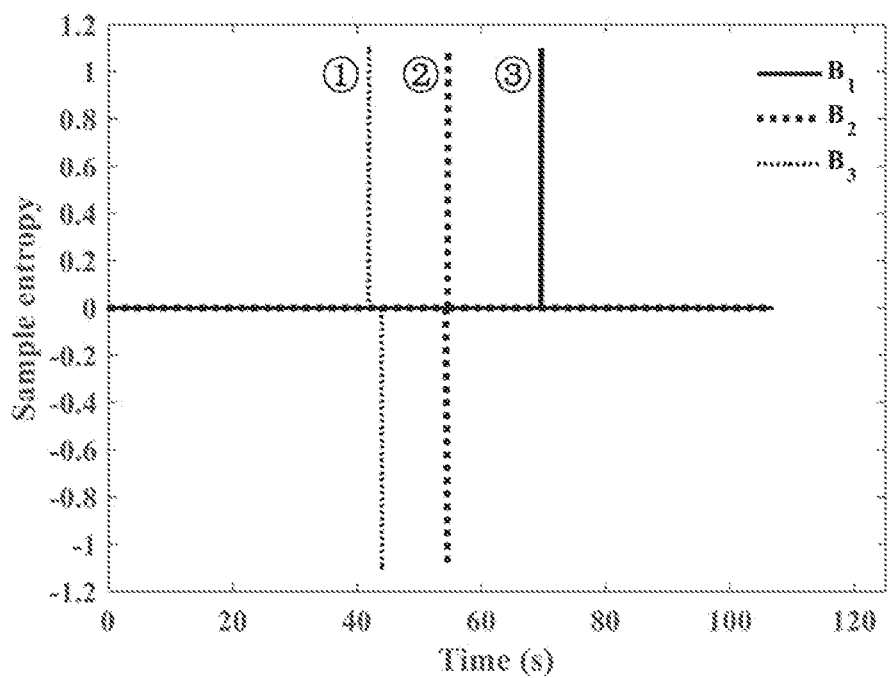
Figure 5D:
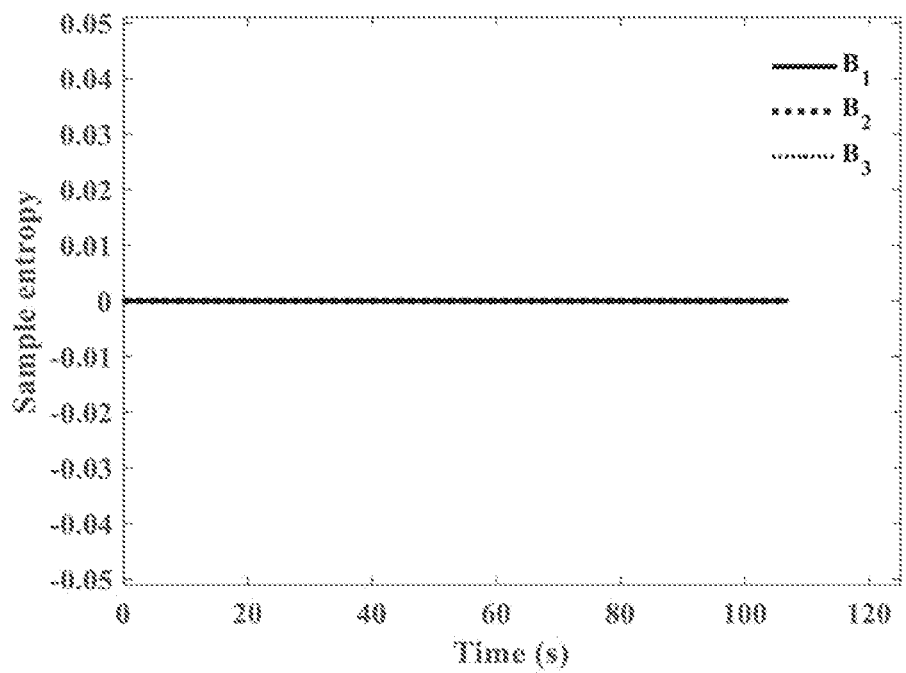

5. Calculation of a corrected sample entropy value of the cell voltage sequence according to the formula (8). The FIG. 4 is a multi-fault diagnosis result of the cell voltage sequence based on the corrected sample entropy under the same condition. A correction coefficient α is introduced according to the cell voltage and the average voltage, and the corrected sample entropy can efficiently predict the abrupt change of the cell voltage and further identify fault types. In FIG. 2, an open-circuit fault ① occurs in $B_3$ at 41.92 seconds, because $V_{B3}(t)=3.519$ V>$V_{avg}(t)=3.429$ V, at the same time, a positive sample entropy is generated for the first time, such as ① in FIG. 4. When the fault disappears at 44.01 seconds, because $V_{B3}(t)=3.153$ V<$V_{avg}(t)=3.316$ V, a negative sample entropy is generated at the same time. A short-circuit fault ② occurs in $B_2$ at 54.54 seconds, and at the same time, the sample entropy decreases for the first time, and then increases suddenly when the fault disappears at 54.68 seconds. In the example, the time of the occurrence and disappearance of the abnormal voltage is completely consistent with the time of the increase and decrease of the corrected sample entropy, so that the fault diagnosis method based on the corrected sample entropy can accurately predict the time of occurrence of the fault. Similarly, the corrected sample entropy of $B_1$ cell voltage suddenly increases when a fault ③ occurs and disappears, indicating that this is an open-circuit fault. The multi-fault diagnosis method of a lithium-ion battery pack based on corrected sample entropy can effectively predict the fault type and time of cells.

The following verifies sensitivity of the corrected sample entropy to the size of the sliding window.

For on-line implementation, the sample entropy value of the cell voltage sequence should be calculated in real time. Thus, a sliding window is configured to update cell data in real time and maintain sensitivity to faults. Particularly, a sample entropy value at each time is calculated from a cell voltage in the previous historical sliding window. N represents the size of the sliding window. The size of the sliding window essentially determines the sample entropy value and the sensitivity of the sample entropy to faults. For the same cell voltage sequence, the smaller the sliding window is, the larger the sample entropy value is, indicating a higher sensitivity to faults, and therefore a smaller sliding window can provide better accuracy in battery fault diagnosis. According to the formulas (5)-(7), when the size of the sliding window is less than 5, the sample entropy value is constant to 0 regardless of any abnormal change in voltage. When the sliding window is too short, the provided method cannot detect any fault. Theoretically, the optimal sliding window size is 5, and strong robustness and efficient calculation can be achieved for measurement noise and interference.

FIGS. 5 (a)-5 (d) are fault diagnosis results of different sliding window sizes based on the corrected sample entropy for the voltage sequence of FIG. 2. The size of the sliding window is N=90 in FIG. 5 (a), N=30 in FIG. 5 (b), N=5 in FIG. 5 (c), and N=4 in FIG. 5 (d), respectively. It indicates that when the sliding window N≥5, the smaller the sliding window is, the more sensitive to faults is.

Figure 6A:
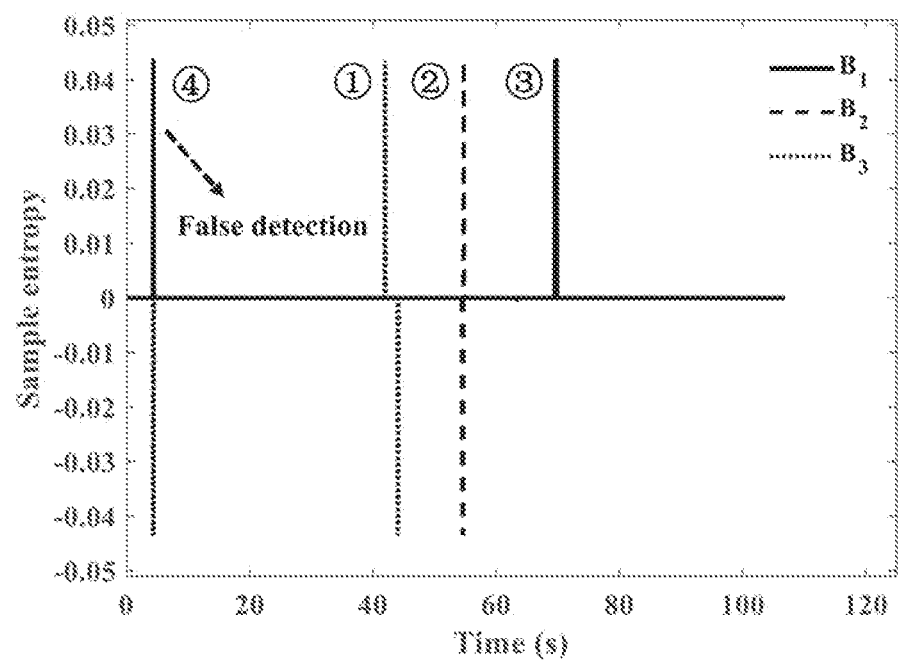
FIG. 6 (a) is a multi-fault diagnosis diagram of a lithium-ion battery pack at a tolerance of 0.1 based on the corrected sample entropy algorithm for the voltage sequence of FIG. 2 of an example of Embodiment 1 of the present disclosure.
Figure 6B:
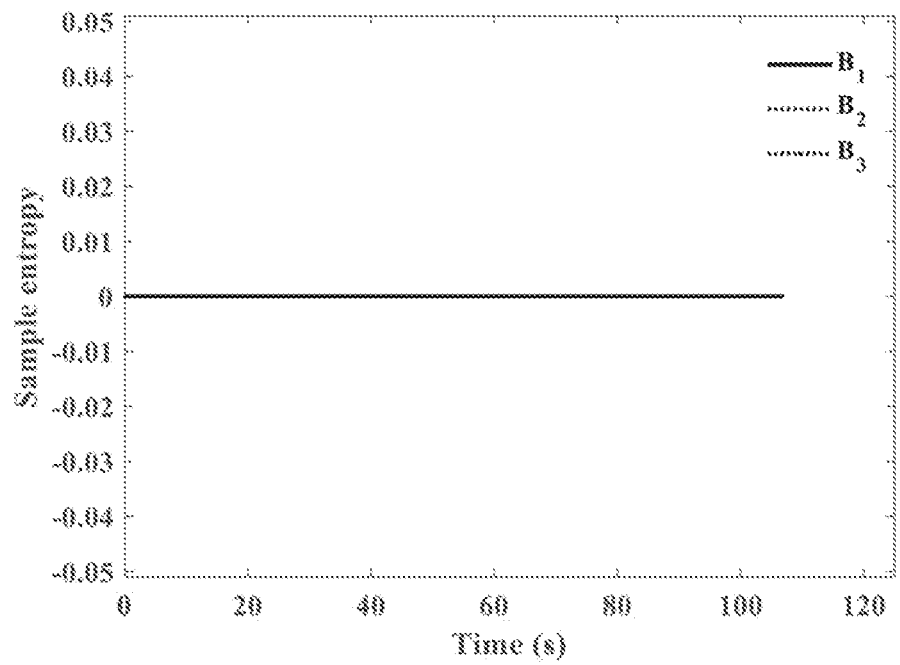

In order to illustrate the robustness of the method provided by the embodiment to the tolerance r, FIG. 6 shows a fault diagnosis result of the cell voltage sequence shown in FIG. 2 at different tolerances based on the corrected sample entropy. The size of each moving window is set to N=60. As shown in FIG. 6 (a), under a small tolerance, i.e., r=0.1, false diagnosis ④ will be marked under normal charge/discharge state transition, corresponding to the voltage fluctuation ④ in FIG. 2, and it can be seen that the method provided by the embodiment is too sensitive to fluctuation in the cell voltages under the small tolerance. As shown in FIG. 6 (b), in the case of a large tolerance such as r=0.5, since the provided method is insensitive to the fluctuation in the cell voltages, the provided method will fail to detect any faults. Therefore, the suitable tolerance r should be chosen according to different applications, usually between 10-20% of a standard deviation of the cell voltages, and the provided fault diagnosis method has strong robustness on measurement noise in the range.

Figure 7A:
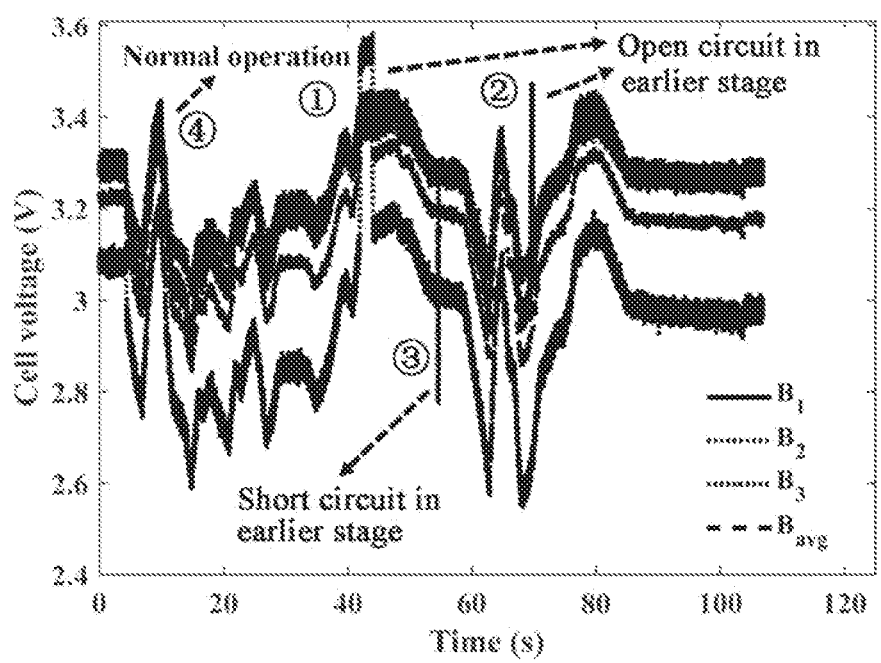
FIG. 7 (a) is a diagram of a voltage sequence of an example of Embodiment 1 of the present disclosure with white noise added to the diagram of the cell voltage sequence of FIG. 2.
Figure 7B:
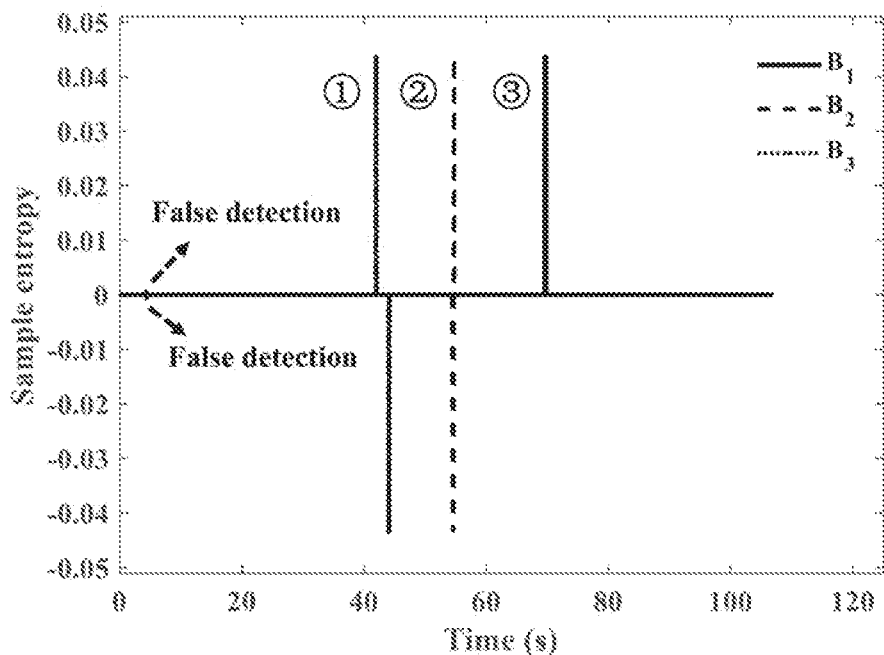
Figure 7C:
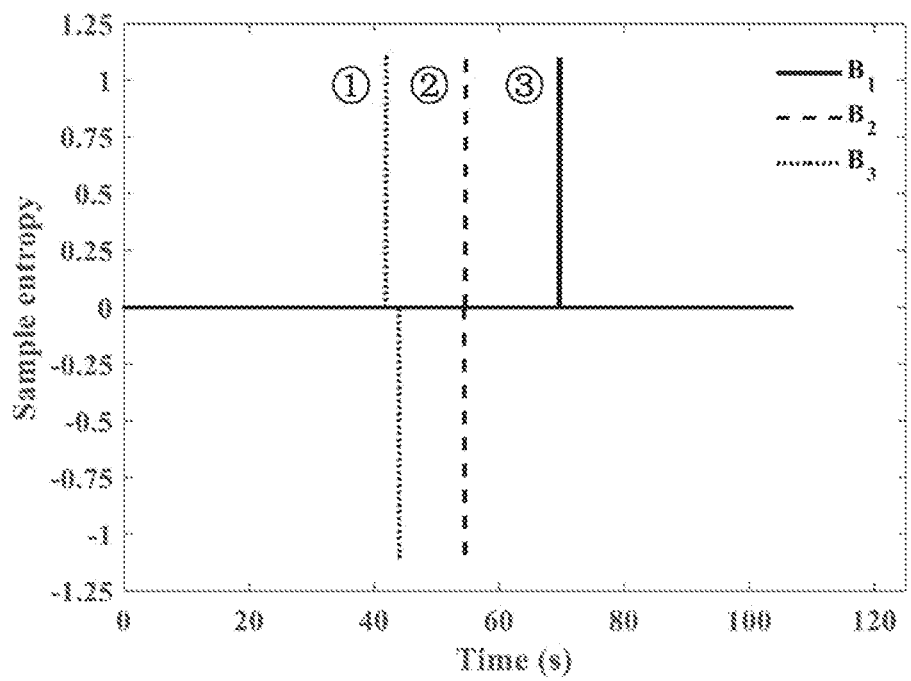

In order to illustrate the robustness of the method on measurement noise, FIG. 7 shows a fault diagnosis result of a cell voltage sequence under white noise at a signal-to-noise ratio of 40 dB. As shown in FIG. 7 (a), compared with FIG. 2, curves of cell voltages become thicker because white noise of the signal-to-noise ratio of 40 dB is added to the cell voltages, respectively. As shown in FIG. 7 (b), on the condition that the size of a moving window is N=60, false diagnosis of B1 and B3 is detected respectively at the time t=4.35 s due to the influence of white noise. As shown in FIG. 7 (c), when the size of the moving window is reduced to N=5, the sample entropy value of the fault is large, and the provided method can accurately predict cell short-circuit and open-circuit faults without any false diagnosis. This proves that the provided fault diagnosis method can have high robustness on measurement noise by optimizing the size of the moving window.

Embodiment 2

The embodiment provides a multi-fault diagnosis system for battery packs based on corrected sample entropy, comprising:

a module, configured to measure cell voltages of a battery pack to be diagnosed;

a module, configured to construct a cell voltage sequence according to the measured cell voltages of the battery pack to be diagnosed and calculate a sample entropy value of the cell voltage sequence;

a module, configured to set a correction coefficient for representing voltage fluctuation information, and correct the sample entropy value through the correction coefficient to obtain a corrected sample entropy value; and a module, configured to judge and output a fault type of the battery pack to be diagnosed according to a numerical value change of the corrected sample entropy value.

The correction coefficient for representing a voltage fluctuation direction is as follows:

when the real-time cell voltage at the time t is smaller than an average cell voltage in a sliding window N, the correction coefficient is a negative number;

when the real-time cell voltage at the time t is larger than an average cell voltage in a sliding window N, the correction coefficient is a positive number; and when the real-time cell voltage at the time t is equal to an average cell voltage in a sliding window N, the correction coefficient is zero.

A judging method of the module configured to judge and output the fault type of the battery pack to be diagnosed according to a numerical value change of the corrected sample entropy value specifically comprises:

if the corrected sample entropy value suddenly rises, judging that an over-voltage or open-circuit fault occurs; and if the corrected sample entropy value suddenly drops, judging that an under-voltage or short-circuit fault occurs.

Embodiment 3

The embodiment provides an electronic device, comprising a memory, a processor and computer instructions stored on the memory and executed on the processor, wherein the steps of the method of the Embodiment 1 are completed when the computer instructions are executed by the processor.

Embodiment 4

The embodiment provides a computer readable storage medium, configured to store computer instructions, wherein the steps of the method of the Embodiment 1 are completed when the computer instructions are executed by the processor.

It should be understood that in the present disclosure, the processor may be a central processing unit CPU, and the processor may be another general-purpose processor, a digital signal processor DSP, an application-specific integrated circuit ASIC, a field programmable gate array FPGA or another programmable logical device, a discrete gate or a transistor logical device, a discrete hardware component and the like. The general-purpose processor may be a microprocessor, or the processor may be any conventional processor and the like.

The memory may include a read-only memory and a random access memory, and provide an instruction and data to the processor. A part of the memory may further include a non-volatile random access memory. For example, the memory may further store information about a device type.

During implementation, the steps of the foregoing method may be completed through an integrated logic circuit of hardware or an instruction in the form of software in the processor. Steps of the methods disclosed with reference to the present disclosure may be directly performed and completed by a hardware processor, or may be performed and completed by using a combination of hardware and a software module in the processor. The software module may be located in a mature storage medium in the field such as a random access memory, a flash memory, a read-only memory, a programmable read-only memory, an electrically erasable programmable memory, or a register. The storage medium is located in the memory. The processor reads information in the memory and completes the steps of the foregoing methods in combination with hardware thereof. To avoid repetition, details are not described herein. A person of ordinary skill in the art may be aware that the units (i.e., algorithm steps) in the examples described with reference to the embodiments disclosed herein may be implemented by electronic hardware or a combination of computer software and electronic hardware. Whether the functions are executed in a mode of hardware or software depends on particular applications and design constraint conditions of the technical solutions. A person skilled in the art may use different methods to implement the described functions for each particular application, but it should not be considered that the implementation goes beyond the scope of the present disclosure.

A person skilled in the art can clearly understand that for convenience and conciseness of description, for specific working processes of the foregoing described system, apparatus and unit, refer to the corresponding processes in the foregoing method embodiments, and details are not described herein.

In the embodiments provided in the present disclosure, it is to be understood that the disclosed system, apparatus, and method may be implemented in other manners. For example, the described apparatus embodiment is merely schematic. For example, the unit division is merely a logical function division and may be other division during actual implementation. For example, a plurality of units or components may be combined or integrated into another system, or some features may be ignored or not performed. In addition, the coupling, direct coupling or communication connection shown or discussed may be indirect coupling or communication connection through some interfaces, apparatuses or units, and may be electrical, mechanical or in other forms.

If implemented in the form of software functional units and sold or used as an independent product, the functions may also be stored in a computer readable storage medium. Based on such an understanding, the technical solutions of the present disclosure essentially, or the part contributing to the prior art, or a part of the technical solutions may be embodied in the form of a software product. The computer software product is stored in a storage medium and includes several instructions for instructing a computer device (which may be a PC, a server or a network device and the like) to perform all or some of the steps of the methods described in the embodiments of the present disclosure. The foregoing storage medium includes: any medium that can store program code, such as a USB flash drive, a removable hard disk, a read-only memory (ROM), a random access memory (RAM), a magnetic disk, or an optical disc.

The foregoing descriptions are merely preferable embodiments of the present disclosure, but are not intended to limit the present disclosure. The present disclosure may include various modifications and changes for a person skilled in the art. Any modification, equivalent replacement, or improvement and the like made within the spirit and principle of the present disclosure shall fall within the protection scope of the present disclosure.

The specific implementations of the present disclosure are described above with reference to the accompanying drawings, but are not intended to limit the protection scope of the present disclosure. A person skilled in the art should understand that various modifications or transformations may be made without creative efforts based on the technical solutions of the present disclosure, and such modifications or transformations shall fall within the protection scope of the present disclosure.

What is claimed is:

1. A multi-fault diagnosis method for battery packs based on corrected sample entropy, comprising the following steps:
    measuring cell voltages of a battery pack to be diagnosed;
    constructing a cell voltage sequence according to the measured cell voltages of the battery pack to be diagnosed, and calculating a sample entropy value of the cell voltage sequence;
    setting a correction coefficient for representing voltage fluctuation information, and correcting the sample entropy value through the correction coefficient to obtain a corrected sample entropy value; and
    judging and outputting a fault type of the battery pack to be diagnosed according to a numerical value change of the corrected sample entropy value; wherein the correction coefficient for representing a voltage fluctuation direction is as follows:
        when a real-time cell voltage at a time t is smaller than an average cell voltage in a sliding window N, the correction coefficient is a negative number,
        when the real-time cell voltage at the time t is larger than the average cell voltage in a sliding window N, the correction coefficient is a positive number, and
        when the real-time cell voltage at the time t is equal to the average cell voltage in a sliding window N, the correction coefficient is zero; wherein
    in the judging and outputting the fault type of the battery pack to be diagnosed, the judging method specifically comprises:
        if the corrected sample entropy value rises, judging that an over-voltage or open-circuit fault occurs; and
        if the corrected sample entropy value drops, judging that an under-voltage or short-circuit fault occurs.

2. The multi-fault diagnosis method for battery packs based on corrected sample entropy according to claim 1, wherein before the step of constructing the cell voltage sequence according to the measured cell voltages of the battery pack to be diagnosed, and calculating the sample entropy value of the cell voltage sequence, a pre-judgment step is further comprised:
    setting a threshold range of cell voltages;
    judging whether a cell voltage is larger than a maximum threshold value of the threshold range or not, if yes, judging that an over-voltage fault occurs, and if not, executing the next step; and
    judging whether a cell voltage is smaller than a minimum threshold value of the threshold value range or not, if yes, judging that an under-voltage fault occurs, and if not, executing the next step.

3. The multi-fault diagnosis method for battery packs based on corrected sample entropy according to claim 1, wherein constructing the cell voltage sequence according to the measured cell voltages of the battery pack to be diagnosed and calculating the sample entropy value of the cell voltage sequence comprise the specific steps:
    constructing a time series by adopting N cell voltage data according to the measured cell voltages of the battery pack to be diagnosed, and constructing a cell voltage vector with N as a sliding window;

calculating a first probability of matching of two time series of an m window length and a second probability of matching of two time series of an m+1 window length; and calculating a sample entropy value according to the first probability and the second probability, wherein the sample entropy value is a conditional probability of matching of the time series of the m+1 window length when the time series of the m window length are matched within a tolerance r.

4. The multi-fault diagnosis method for battery packs based on corrected sample entropy according to claim 1, wherein the correction coefficient is specifically as follows:

$$\alpha = \begin{cases} -1, & \text{When } V(t) < V_{avg} \\ 1, & \text{When } V(t) > V_{avg} \\ 0, & \text{Otherwise} \end{cases},$$

wherein V(t) is the real-time cell voltage at the time t, and $V_{avg}$ is the average cell voltage in a sliding window N.

5. An electronic device, comprising a memory, a processor and computer instructions stored on the memory and executed on the processor, wherein the steps of the method of claim 1 are completed when the computer instructions are executed by the processor.

6. A non-transitory computer-readable storage medium, configured to store computer instructions, wherein the steps of the method of claim 1 are executed when the computer instructions are executed by a processor.

7. A multi-fault diagnosis system based on corrected sample entropy, comprising:

a module, configured to measure cell voltages of a battery pack to be diagnosed;

a module, configured to construct a cell voltage sequence according to the measured cell voltages of the battery pack to be diagnosed and calculate a sample entropy value of the cell voltage sequence;

a module, configured to set a correction coefficient for representing voltage fluctuation information, and correct the sample entropy value through the correction coefficient to obtain a corrected sample entropy value; and a module, configured to judge and output a fault type of the battery pack to be diagnosed according to a numerical value change of the corrected sample entropy value; wherein the correction coefficient for representing a voltage fluctuation direction is as follows:

when a real-time cell voltage at a time t is smaller than an average cell voltage in a sliding window N, the correction coefficient is a negative number;

when the real-time cell voltage at the time t is larger than an average cell voltage in a sliding window N, the correction coefficient is a positive number; and when the real-time cell voltage at the time t is equal to an average cell voltage in a sliding window N, the correction coefficient is zero;

a judging method of the module configured to judge and output the fault type of the battery pack to be diagnosed specifically comprises:

if the corrected sample entropy value rises, judging that an over-voltage or open-circuit fault occurs; and if the corrected sample entropy value drops, judging that an under-voltage or short-circuit fault occurs.

* * * * *